(12) United States Patent
Huang et al.

(10) Patent No.: US 9,542,879 B2
(45) Date of Patent: Jan. 10, 2017

(54) DISPLAY PANEL

(71) Applicant: E Ink Holdings Inc., Hsinchu (TW)

(72) Inventors: Kai-Mao Huang, Hsinchu (TW);
San-Long Lin, Hsinchu (TW);
Chi-Ming Wu, Hsinchu (TW);
Shu-Hao Chang, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 14/882,437

(22) Filed: Oct. 13, 2015

(65) Prior Publication Data
US 2016/0042683 A1    Feb. 11, 2016

Related U.S. Application Data

(63) Continuation of application No. 14/174,824, filed on Feb. 6, 2014, now Pat. No. 9,190,403.

(30) Foreign Application Priority Data

Jun. 7, 2013    (TW) ............... 102120432 U

(51) Int. Cl.
*H01L 29/207*    (2006.01)
*G09G 3/20*    (2006.01)
(Continued)

(52) U.S. Cl.
CPC ............ *G09G 3/2096* (2013.01); *G09G 3/006* (2013.01); *H01L 27/0251* (2013.01);
(Continued)

(58) Field of Classification Search
CPC ........... H01L 27/14609; H01L 27/1463; H01L 27/1214; H01L 27/3246; H01L 27/3251
(Continued)

(56) References Cited

U.S. PATENT DOCUMENTS 7,453,420 B2    11/2008    Watanabe et al.
7,838,939 B2    11/2010    Russ et al.
(Continued)

FOREIGN PATENT DOCUMENTS

CN    1748237 A    3/2006
CN    1797140 A    7/2006
(Continued)

OTHER PUBLICATIONS

Corresponding Chinese Office Action that these art references were cited on Aug. 3, 2016.

*Primary Examiner* — Matthew E Warren
(74) *Attorney, Agent, or Firm* — CKC & Partners Co., Ltd.

(57) ABSTRACT

A display panel and a manufacturing method thereof are disclosed herein. The display panel includes a substrate, a peripheral circuit, a plurality of pixel electrodes, a plurality of switches, and an insulating layer. The substrate has a display region and a non-display region. At least a portion of the peripheral circuit is located on the display region of the substrate. The pixel electrodes are located on the display region of the substrate. The switches are respectively and electrically connected to the pixel electrodes, configured to be respectively switched on according to a plurality of scan signals, so as to transmit a plurality of data signals to the pixel electrodes. The insulating layer is located between the peripheral circuit and the pixel electrodes, and is configured to prevent the peripheral circuit from interfering with the pixel electrodes.

9 Claims, 4 Drawing Sheets

(51) Int. Cl.
*H01L 27/02* (2006.01)
*H01L 27/146* (2006.01)
*H01L 27/12* (2006.01)
*G09G 3/00* (2006.01)
*H01L 27/32* (2006.01)

(52) U.S. Cl.
CPC ...... *H01L 27/1248* (2013.01); *H01L 27/1463* (2013.01); *H01L 27/14609* (2013.01); *G09G 2300/0426* (2013.01); *G09G 2330/04* (2013.01); *G09G 2330/12* (2013.01); *H01L 27/3251* (2013.01)

(58) Field of Classification Search
USPC .............................................. 257/52, 79, 93
See application file for complete search history.

(56) References Cited

U.S. PATENT DOCUMENTS

| | | | |
|---|---|---|---|
| 8,587,040 B2 | 11/2013 | Kobayashi et al. | |
| 2009/0174975 A1* | 7/2009 | Huang | G09G 3/3611 361/56 |
| 2010/0110271 A1 | 5/2010 | Yanagita et al. | |
| 2011/0234957 A1* | 9/2011 | Watanabe | G02F 1/1345 349/139 |
| 2014/0176838 A1* | 6/2014 | Hong | G02F 1/134363 349/33 |

FOREIGN PATENT DOCUMENTS

| | | |
|---|---|---|
| CN | 1982957 A | 6/2007 |
| CN | 101271207 A | 9/2008 |
| CN | 101872593 A | 10/2010 |
| CN | 102404514 A | 4/2012 |

* cited by examiner

DISPLAY PANEL

RELATED APPLICATIONS

The present application is a continuation application of U.S. application Ser. No. 14/174,824, filed on Feb. 6, 2014, which was based on, and claims priority from, Taiwanese Patent Application Serial Number 102120432, filed Jun. 7, 2013, the disclosure of which is hereby incorporated by reference herein in its entirely.

BACKGROUND

Field of Invention

The present disclosure relates to an electronic apparatus and a manufacturing method thereof. More particularly, the present invention relates to a display panel and a manufacturing method thereof.

Description of Related Art

With advances in technology, display panels are widely used in various kinds of electronic devices, such as smartphones, tablet computers, and e-paper devices.

A display panel typically includes a substrate. The substrate includes a display region and a non-display region (i.e., a peripheral region). Typically, a peripheral circuit is disposed on the non-display region, and is configured to provide electrostatic discharge protection or to transmit signals to components on the display region. However, with such a configuration, a space on the non-display region is needed where the peripheral circuit can be disposed, and such a restriction limits the degree to which the rim of the display panel can be made thinner and smaller.

Thus, in order to allow for more widespread use of the display panel, a display panel with a thin rim is desired.

SUMMARY

One aspect of the present invention is directed to a display panel. In accordance with one embodiment of the present invention, the display panel includes a substrate, a peripheral circuit, a plurality of pixel electrodes, a plurality of switches, and an insulating layer. The substrate includes a display region and a non-display region. At least a portion of the peripheral circuit is located on the display region. The pixel electrodes are located on the display region. The switches are respectively and electrically connected to the pixel electrodes. The switches are configured to be switched on according to a plurality of scan signals respectively, so as to transmit a plurality of data signals to the pixel electrodes. The insulating layer is located between the peripheral circuit and the pixel electrodes. The insulating layer is configured to prevent the peripheral circuit from interfering with the pixel electrodes.

Another aspect of the present invention is directed to a display panel. In accordance with one embodiment of the present invention, the display panel includes a substrate, a plurality of data lines, a plurality of scan lines, a peripheral circuit, a plurality of pixel electrodes, a plurality of switches, a display layer, and an insulating layer. The substrate includes a display region and a non-display region. The data lines are disposed on the substrate. The scan lines are disposed on the substrate and are intersected with the data lines. The peripheral circuit is disposed on the substrate. The peripheral circuit is configured to be electrically connected to at least one of the data lines or at least one of the scan lines, and at least a portion of the peripheral circuit is located on the display region. The pixel electrodes are located on the display region. The switches are disposed on the substrate and respectively and electrically connected to the pixel electrodes. The switches are configured to be turned on respectively according to a plurality of scan signals to transmit a plurality of data signals to the pixel electrodes. The display layer is located on the pixel electrodes. The display layer is configured to display an image according to the data signals received by the pixel electrodes. The insulating layer is configured to overlay at least the portion of the peripheral circuit located on the display region to prevent the peripheral circuit from interfering with the pixel electrodes.

Another aspect of the present invention is directed to a manufacturing method of a display panel. In accordance with one embodiment of the present invention, the manufacturing method includes providing a substrate including a display region and a non-display region; disposing a peripheral circuit on the substrate, in which at least a portion of the peripheral circuit is located on the display region; forming a plurality of pixel electrodes located on the display region; forming a plurality of switches on the substrate, in which the switches are electrically and respectively connected to the pixel electrodes, and the switches are configured to be switched on according to a plurality of scan signals respectively, so as to transmit a plurality of data signals to the pixel electrodes; and forming an insulating layer located between the peripheral circuit and the pixel electrodes, in which the insulating layer is configured to prevent the peripheral circuit from interfering with the pixel electrodes.

Thus, through application of one of the embodiments mentioned above, an insulating layer is disposed between the peripheral circuit and the pixel electrodes. With such a configuration, at least one portion of the peripheral circuit can be disposed on the display region without interfering with the pixel electrodes. By disposing at least one portion of the peripheral circuit on the display region, the rim of the display panel can be minimized, such that a display panel with a thin rim can be realized.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1A:
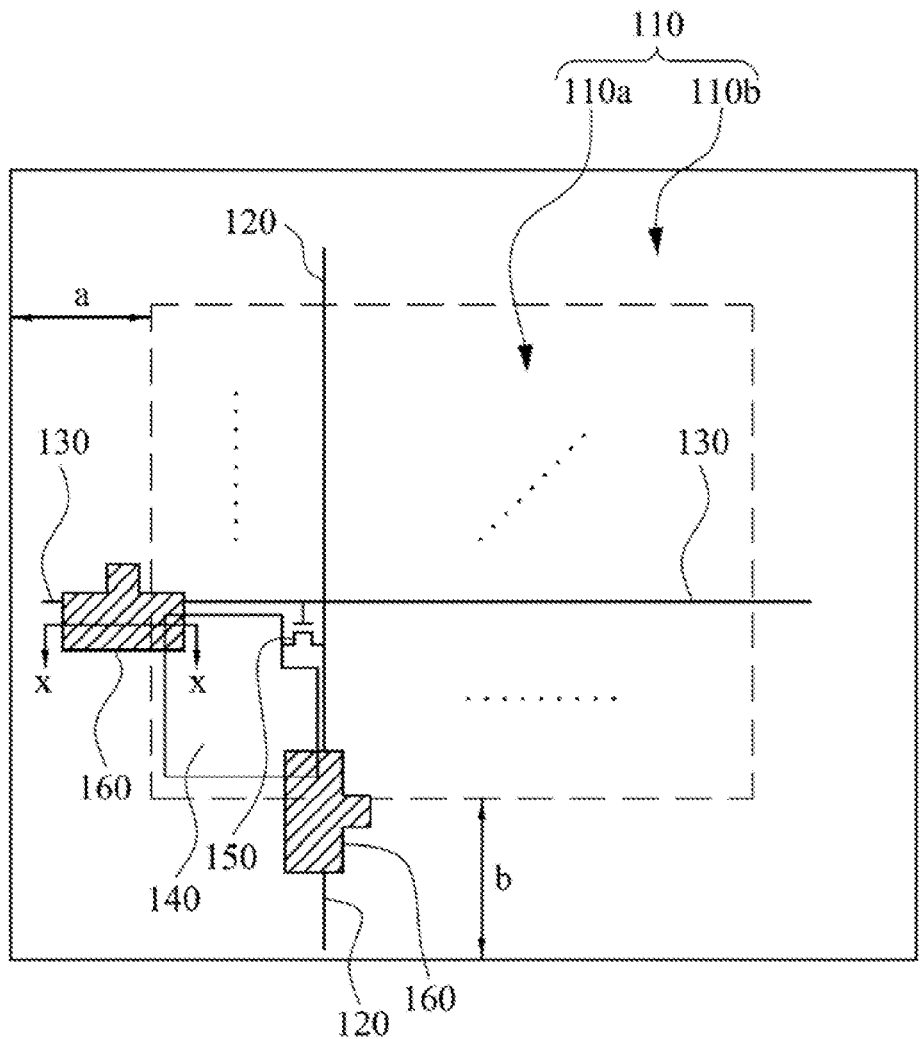
FIG. 1a is a schematic diagram of a display panel in accordance with one embodiment of the present disclosure.

In the following detailed description, for purposes of explanation, numerous specific details are set forth in order to attain a thorough understanding of the disclosed embodiments. It will be apparent, however, that one or more embodiments may be practiced without these specific details. In other instances, well-known structures and devices are schematically shown in order to simplify the drawing.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Moreover, "electrically connect" or "connect" can further refer to the interoperation or interaction between two or more elements.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims herein is not intended to invoke the provisions of 35 U.S.C. §112, 6th paragraph.

One aspect of the present invention is a display panel. The display panel can be a liquid crystal display panel or an e-paper display panel.

Figure 1B:
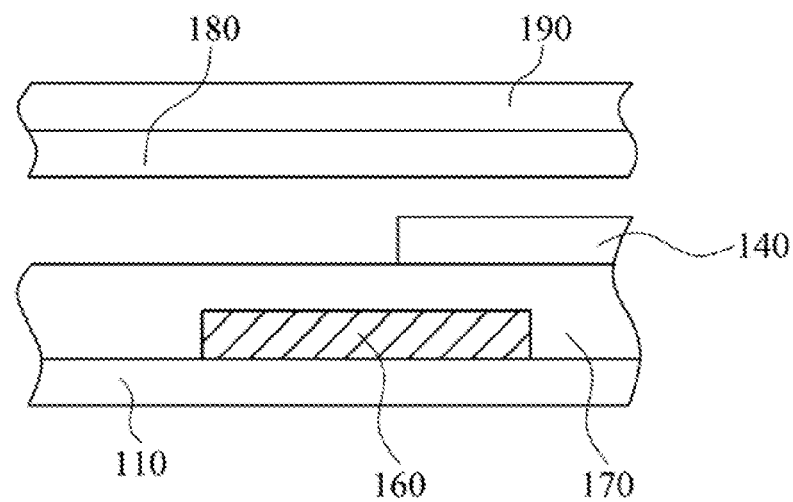
FIG. 1b is a section view of the display panel in FIG. 1a along line x-x.

Reference is now made to FIGS. 1a and 1b, in which FIG. 1a is a schematic diagram of the display panel 100 in accordance with one embodiment of the present disclosure, and FIG. 1b is a section view of the display panel 100 in FIG. 1 along line x-x. In this embodiment, the display panel 100 includes a substrate 110, a plurality of data lines 120, a plurality of scan lines 130, a plurality of pixel electrodes 140, a plurality of switches 150, at least one peripheral circuit (e.g., electrostatic discharge (ESD) protection circuits 160), an insulating layer 170, a display layer 180, and a transparent electrode layer 190.

In this embodiment, the data lines 120 are configured to transmit a plurality of data signals to the switches 150. The scan lines 130 are configured to transmit a plurality of scan signals to each row of the switches sequentially. The switches 150 are, for example, thin film transistors (TFTs), and are configured to be turned on according to the scan signals to transmit the data signals to the pixel electrodes 140. The display layer 180 is, for example, an electronic ink material layer, and is configured to display an image according to the data signals received by the pixel electrodes 140 (e.g., display the image according to the electrical field between the pixel electrodes 140 and the transparent electrode layer 190).

The peripheral circuit is configured to be electrically connected to at least one of the data lines 120 or at least one of the scan lines 130 to transmit signals to components on a display region 110a of the substrate 110 or to provide electrostatic discharge protection. In this embodiment, the at least one peripheral circuit includes a plurality of ESD protection circuits 160. The ESD protection circuits 160 are configured to be separately electrically connected to the data lines 120 and the scan lines 130 to prevent the display panel 100 from being damaged by electrostatic discharge. For example, when electrostatic charges are accumulated on the data lines 120 and the scan lines 130, the ESD protection circuits 160 can conduct the electrostatic charges on the data lines 120 and the scan lines 130 to an electrostatic discharge ring or the ground. In addition, the ESD protection circuits 160 can also prevent external electrostatic charges from entering the display panel 100.

In one embodiment, the substrate 110 includes a display region 110a and a non-display region 110b. The data lines 120 are disposed on the substrate 110. The scan lines 130 are disposed on the substrate 110 and are intersected with the data lines 120. The ESD protection circuits 160 are disposed on the substrate 110, in which at least a portion of the ESD protection circuits 160 are located on the display region 110a. The pixel electrodes 140 are located on the display region 110a and are overlapped with at least a portion of the ESD protection circuits 160. That is, an orthogonal projection of the pixel electrodes 140 on the substrate 110 is at least partially overlapped with an orthogonal projection of the ESD protection circuits 160 on the substrate 110. The switches 150 are disposed on the substrate 110. The display layer 180 is located on the pixel electrodes 140. The transparent electrode layer 190 is located on the display layer 180. The insulating layer 170 is located between the ESD protection circuits 160 and the pixel electrodes 140 to prevent the ESD protection circuits 160 from interfering with the pixel electrodes 140. In addition, in some embodiments, the insulating layer 170 can overlay a portion of the ESD protection circuits 160, in which said portion of the ESD protection circuits 160 is located on the display region 110a, or can totally overlay the ESD protection circuits 160. Moreover, in some embodiments, the thickness of a portion of the insulating layer 170 interposed between the ESD protection circuits 160 and the pixel electrodes 140 is greater than 15 kÅ, so as to prevent the ESD protection circuits 160 from interfering with the pixel electrodes 140.

By disposing the insulating layer 170 between the peripheral circuit (e.g., ESD protection circuits 160) and the pixel electrodes 140, at least one portion of the peripheral circuit can be disposed on the display region 110a without interfering with the pixel electrodes 140. By disposing at least one portion of the peripheral circuit on the display region 110a, the size of the rim of the display panel 100 (e.g., width a, b) can be minimized, such that a display panel with a thin rim can be realized.

In some embodiments, the substrate 110, for example, can be fabricated by glass, quartz, or flexible materials. The data lines 120 and the scan lines 130 can be fabricated by aluminum, chromium, aluminum alloy, chromium alloy, or other suitable conducting materials. The pixel electrodes 140, for example, can be fabricated by metal, indium tin oxide, indium zinc oxide, or other suitable materials. The ESD protection circuits 160, for example, can be implemented by thin film transistors or diodes. The insulating layer 170, for example, can be fabricated by silicon nitride, silicon oxide, silicon oxynitride, aluminum oxide, hafnium oxide, or other suitable insulating materials. The transparent electrode layer 190, for example, can be fabricated by indium tin oxide, indium zinc oxide, or other suitable transparent conducting materials. In some embodiments, the display layer 180, for example, includes a plurality of mini capsules and each capsule includes black paint, white paint and transparent fluid. The black paint and the white paint separately have different electric charges (e.g., a positive charge and a negative charge), so as to display an image according to the electrical field between the pixel electrodes 140 and the transparent electrode layer 190. However, in practice, the display layer 180 can also be a liquid crystal material layer or another type of electronic ink material layer. Thus, the type of the display layer 180 is not limited to the embodiment described above.

Figure 2A:
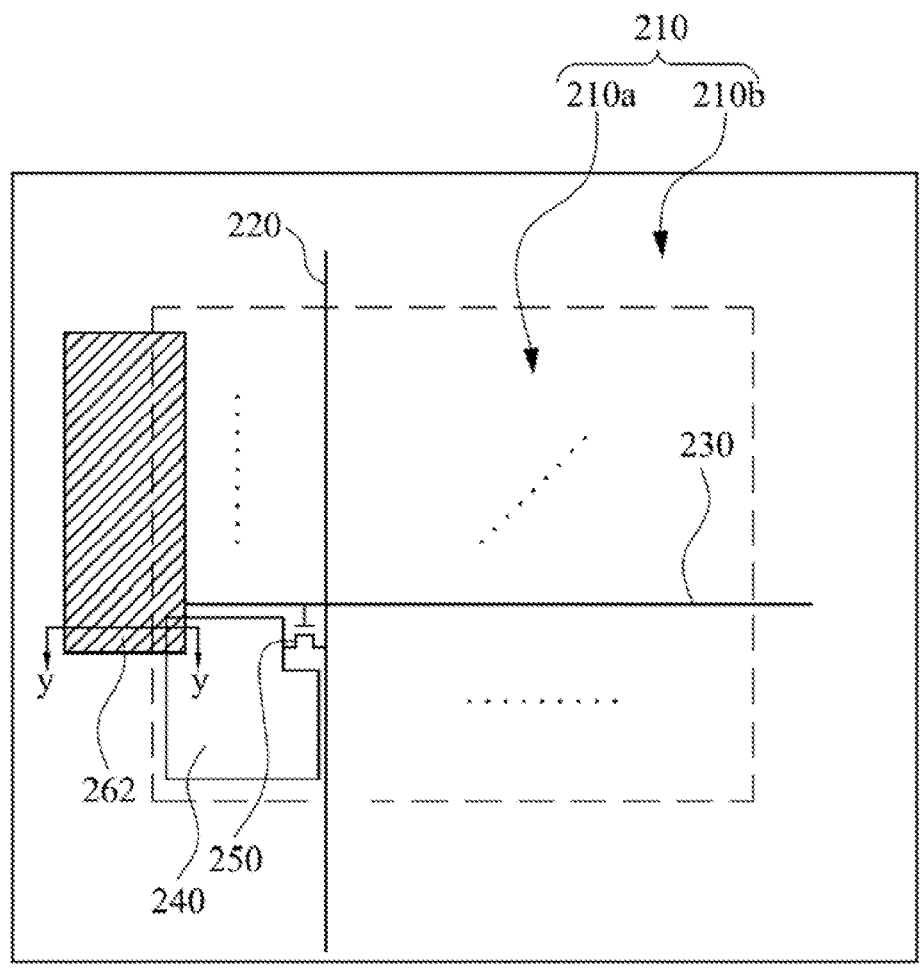
FIG. 2a is a schematic diagram of another display panel in accordance with one embodiment of the present disclosure.
Figure 2B:
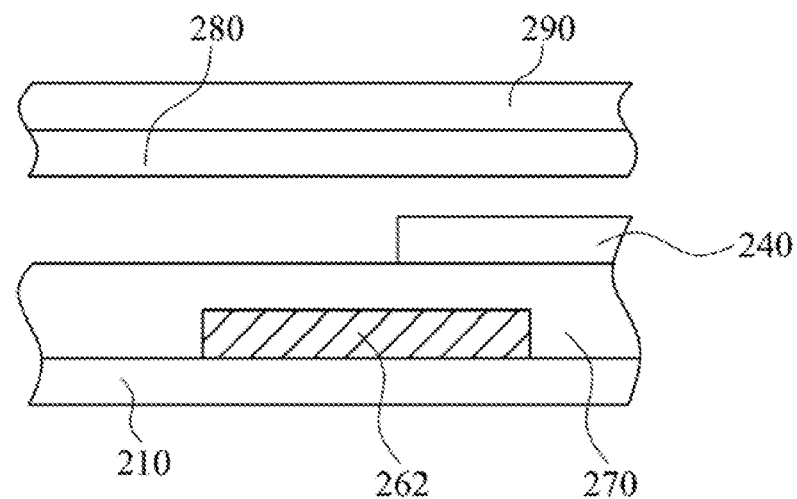
FIG. 2b is a section view of the display panel in FIG. 2a along line y-y.

In the following paragraphs, more details of the invention are provided with reference to another embodiment. Reference is made to FIGS. 2a and 2b, in which FIG. 2a is a schematic diagram of a display panel 200 in accordance with one embodiment of the present disclosure, and FIG. 2b is a section view of the display panel 200 in FIG. 2a along line y-y. In this embodiment, the display panel 200 includes a substrate 210, a plurality of data lines 220, a plurality of scan lines 230, a plurality of pixel electrodes 240, a plurality of switches 250, at least one peripheral circuit (e.g., an amorphous silicon array driver (ARD) 262), an insulating layer 270, a display layer 280, and a transparent electrode layer 290. The substrate 210 includes a display region 210a and a non-display region 210b.

In this embodiment, the functions and the configurations of the components above are similar to the embodiment in FIGS. 1a and 1b. Therefore, aspects of this embodiment that are similar to those of the previous embodiment will not be repeated.

In this embodiment, the at least one peripheral circuit includes an ARD 262. The ARD 262 is configured to be electrically connected with the scan lines 230, and generate the scan signals and provide the scan signals to the switches 250, so as to turn on the switches 250 and make the switches 250 provide the data signals to the pixel electrodes 240.

In this embodiment, the ARD 262 is disposed on the substrate 210, in which at least a portion of the ARD 262 is located on the display region 210a. Also, at least a portion of the ARD 262 is overlapped with the pixel electrodes 240. That is, an orthogonal projection of the pixel electrodes 240 on the substrate 210 is at least partially overlapped with an orthogonal projection of the ARD 262 on the substrate 210. The insulating layer 270 is located between the ARD 262 and the pixel electrodes 240 to prevent the ARD 262 from interfering with the pixel electrodes 240. In addition, in some embodiments, the insulating layer 270 can overlay a portion of the ARD 262, in which said portion of the ARD 262 is located on the display region 210a, or can totally overlay the ARD 262. Moreover, in some embodiments, the thickness of a portion of the insulating layer 270 interposed between the ARD 262 and the pixel electrodes 240 is greater than 15 kÅ, so as to prevent the ARD 262 from interfering with the pixel electrodes 240.

In one embodiment, the ARD 262, for example, can be implemented by thin film transistors.

By using the ARD 262 to generate the scan signals, a scan integrated circuit traditionally used for generating scan signals can be omitted from the configuration of the display panel 200, such that the cost of manufacturing the display panel 200 can be minimized. In addition, through the configurations described above, the peripheral circuit (e.g., the ARD 262) can be disposed on the display region 210a without interfering with the pixel electrodes 240. Hence, a display panel 200 with a thin rim can be realized.

Figure 3A:
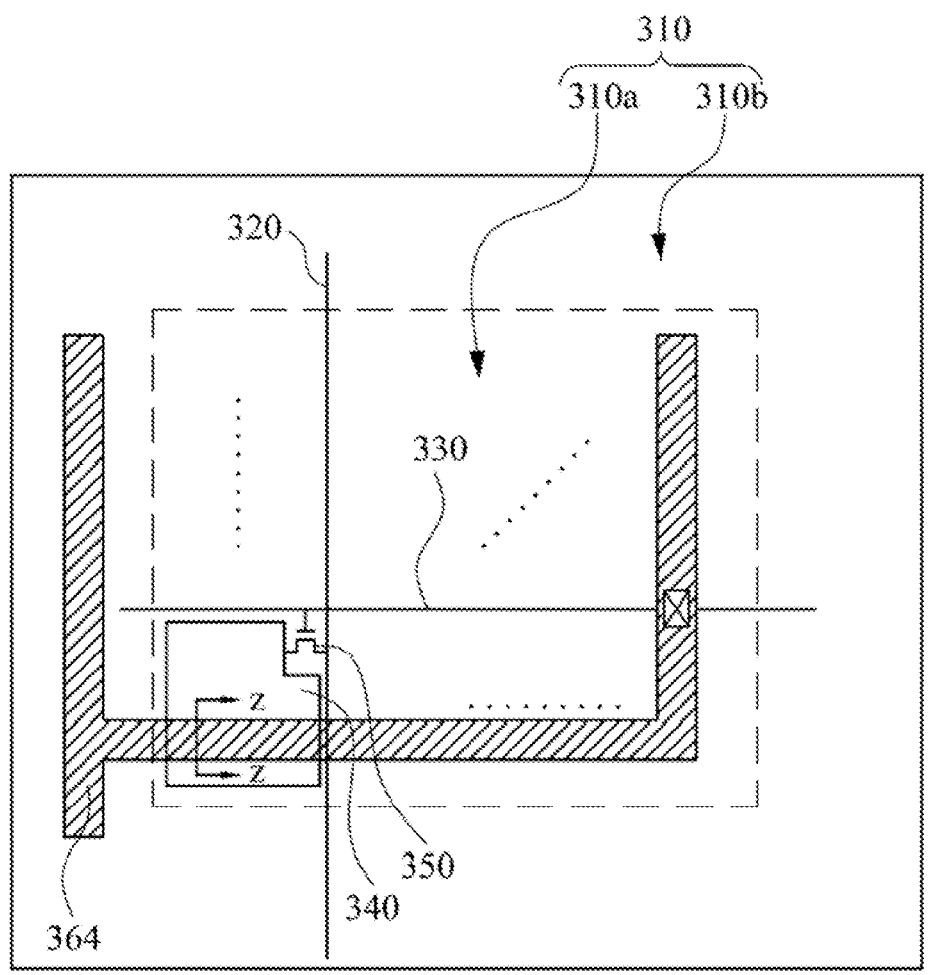
FIG. 3a is a schematic diagram of still another display panel in accordance with one embodiment of the present disclosure.
Figure 3B:
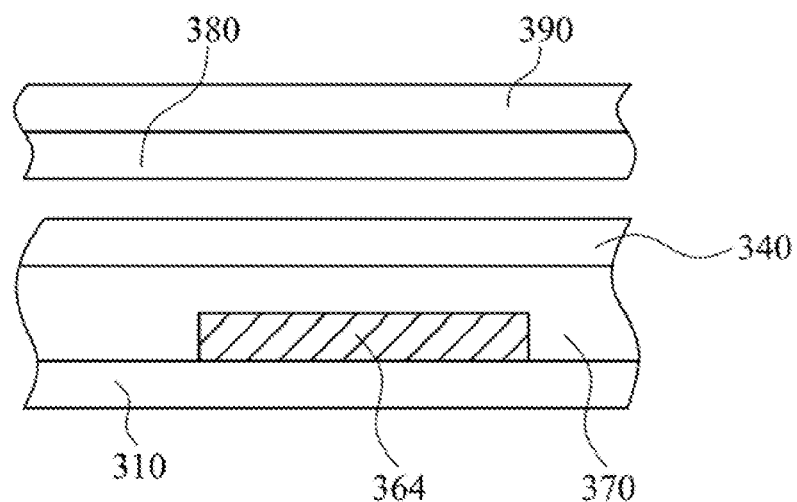
FIG. 3b is a section view of the display panel in FIG. 3a along line z-z.

In the following paragraphs, more details of the invention are provided with reference to another embodiment. Reference is made to FIGS. 3a and 3b, in which FIG. 3a is a schematic diagram of a display panel 300 in accordance with one embodiment of the present disclosure, and FIG. 3b is a section view of the display panel 300 in FIG. 3a along line z-z. In this embodiment, the display panel 300 includes a substrate 310, a plurality of data lines 320, a plurality of scan lines 330, a plurality of pixel electrodes 340, a plurality of switches 350, at least one peripheral circuit (e.g., a shorting bar line 364), an insulating layer 370, a display layer 380, and a transparent electrode layer 390. The substrate 310 includes a display region 310a and a non-display region 310b.

In this embodiment, the functions and the configurations of the components above are similar to the embodiment in FIGS. 1a and 1b. Therefore, aspects of this embodiment that are similar to those of this previous embodiment will not be repeated.

In this embodiment, the at least one peripheral circuit includes a shorting bar line 364. The shorting bar line 364 is configured to be electrically connected to the data lines 320 and/or the scan lines 330. Although in FIG. 3a the shorting bar line 364 is merely electrically connected to the scan lines 330, the invention is not limited to the connection shown in FIG. 3a. In an array test, the shorting bar line 364 is configured to receive a test signal from a test pin, and provide the test signal to at least one of the switches 350 through the data lines 320 and/or scan lines 330 to turn on the at least one of the switches 350, so as to perform testing of the display panel 300.

In this embodiment, the shorting bar line 364 is disposed on the substrate 310, in which at least a portion of the shorting bar line 364 is located on the display region 310a. Also, at least a portion of the shorting bar line 364 is overlapped with the pixel electrodes 340. That is, an orthogonal projection of the pixel electrodes 340 on the substrate 310 is at least partially overlapped with an orthogonal projection of the shorting bar line 364 on the substrate 310. The insulating layer 370 is located between the shorting bar line 364 and the pixel electrodes 340 to prevent the shorting bar line 364 from interfering with the pixel electrodes 340. In addition, in some embodiments, the insulating layer 370 can overlay a portion of the shorting bar line 364, in which said portion of the shorting bar line 364 is located on the display region 310a, or can totally overlay the shorting bar line 364. Moreover, in some embodiments, the thickness of a portion of the insulating layer 370 interposed between the shorting bar line 364 and the pixel electrodes 340 is greater than 15 kÅ, so as to prevent the shorting bar line 364 from interfering with the pixel electrodes 340.

In one embodiment, the shorting bar line 364 can be fabricated with a material identical to the material of the data lines 320 and the scan lines 330.

Through the configurations described above, the peripheral circuit (e.g., the shorting bar line 364) can be disposed on the display region 310a without interfering with the pixel electrodes 340. Hence, a display panel with a thin rim can be realized.

It should be noted that although in FIGS. 1a, 1b, 2a, 2b, 3a, and 3b the peripheral circuit is partially disposed on the display region 110a, 210a, 310a, and partially disposed on the non-display region 110b, 210b, 310b, in practice, the peripheral circuit can be totally disposed on the display region 110a, 210a, 310a, and the disposition thereof is not limited to the embodiment in shown in FIGS. 1a, 1b, 2a, 2b, 3a, and 3b.

Moreover, in some embodiments, the peripheral circuit can include another electronic component, such as a peripheral wire configured to transmit the scan signals or the data signals. The actual content of the peripheral circuit is based on actual requirements, and is not limited to the embodiment above.

Furthermore, in some embodiments, all the ESD protection circuit 160, the ARD 262, and the shorting bar line 364 can be disposed in one display panel, and at least one portion of each of the ESD protection circuit 160, the ARD 262, and the shorting bar line 364 is disposed on the display region.

Another aspect of the invention is a manufacturing method of a display panel. The display panel herein, for example, can be one of the display panels 100, 200, 300 in FIGS. 1a, 1b, 2a, 2b, 3a, and 3b. To simplify the description below, in the following paragraphs, the display panel 100 shown in FIGS. 1a and 1b will be used as an example to describe the manufacturing method according to an embodiment of the present disclosure. However, the invention is not limited to application to the embodiment shown in FIGS. 1a and 1b.

Figure 4:
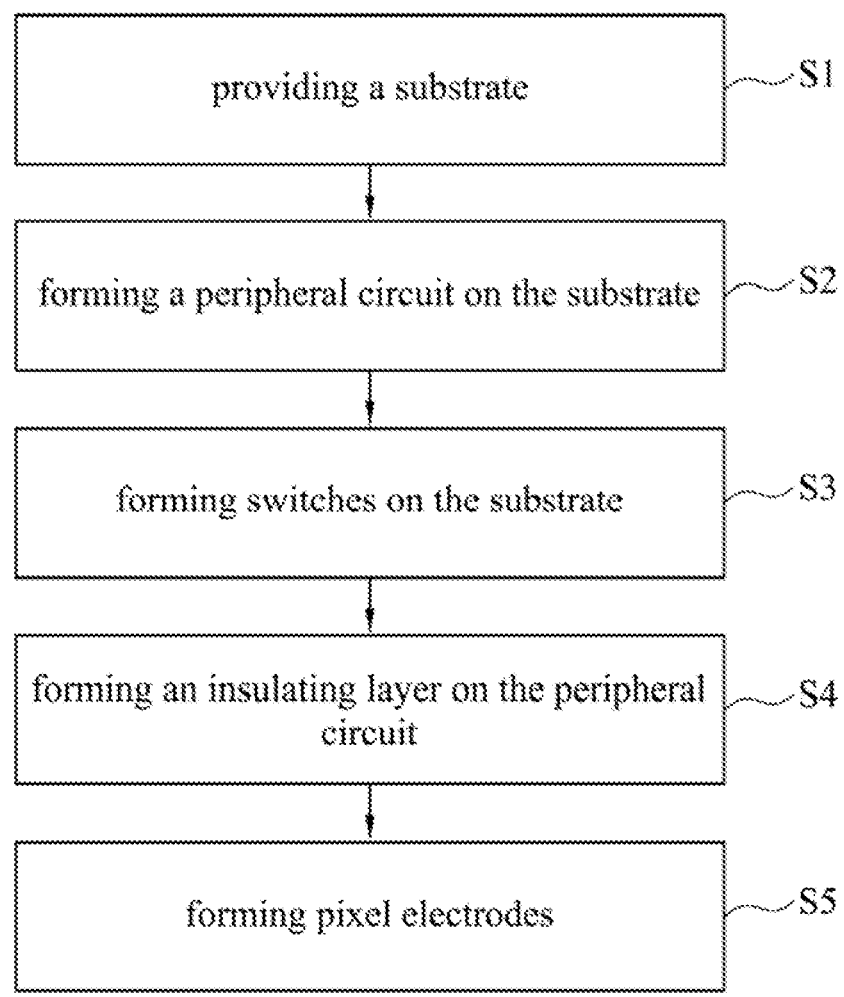
FIG. 4 is a flowchart illustrating a manufacturing method of a display panel in accordance with one embodiment of the present disclosure.

FIG. 4 is a flowchart illustrating a manufacturing method 400 of the display panel 100 in accordance with one embodiment of the present disclosure. It should be noted that in the steps of the following manufacturing method, no particular sequence is required unless otherwise specified. Moreover, the following steps also may be performed simultaneously or the execution times thereof may at least partially overlap. The manufacturing method 400 includes the steps below.

In step S1, a substrate 110 including a display region 110a and a non-display region 110b is provided. In step S2, a peripheral circuit (e.g., an ESD protection circuit 160) is formed on the substrate 110, in which at least a portion of the peripheral circuit is located on the display region 110a. In step S3, a plurality of switches 150 are formed on the substrate 110. In step S4, an insulating layer 170 is formed on the peripheral circuit. In step S5, a plurality of pixel electrodes 140 are formed on display region 110a, and are electrically connected to the switches 150 respectively.

In the steps above, the insulating layer 170 is located between the peripheral circuit and the pixel electrodes 140 to prevent the peripheral circuit from interfering with the pixel electrodes 140. In addition, the switches 150 can be turned on according to a plurality of scan signals separately to transmit a plurality of data signals to the pixel electrodes 140.

In one embodiment, the peripheral circuit includes at least one of the ESD protection circuits 160 shown in FIG. 1a and FIG. 1b, the ARD 262 shown in FIG. 2a and FIG. 2b, and the shorting bar line 364 shown in FIG. 3a and FIG. 3b.

Details of the components in the display panel 100, the ARD 262, and the shorting bar line 364 can be ascertained by referring to the above paragraphs, and a description in this regard will not be repeated herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A display panel comprising:
   a substrate comprising a display region and a non-display region;
   a peripheral circuit, wherein at least a portion of the peripheral circuit is located on the display region;
   a plurality of pixel electrodes located on the display region; and
   an insulating layer located between the peripheral circuit and the pixel electrodes;
   wherein the peripheral circuit comprises an electrostatic discharge (ESD) protection circuit, at least a portion of the ESD protection circuit is located on the display region.

2. The display panel as claimed in claim 1, wherein the ESD protection circuit is configured to electrically connect to a scan line or a data line.

3. The display panel as claimed in claim 1, further comprising:
   a plurality of switches respectively and electrically connected to the pixel electrodes, wherein the switches are configured to be switched on according to a plurality of scan signals respectively, so as to transmit a plurality of data signals to the pixel electrodes.

4. The display panel as claimed in claim 3, wherein the peripheral circuit comprises an amorphous silicon array driver (ARD), at least a portion of the ARD is located on the display region, and the ARD is configured to provide the scan signals to the switches.

5. The display panel as claimed in claim 1, further comprising:
   a display layer configured to display an image according to the data signals received by the pixel electrodes.

6. The display panel as claimed in claim 3, wherein the peripheral circuit comprises a shorting bar line, at least a portion of the shorting bar line is located on the display region, and the shorting bar line is configured to receive a test signal and to provide the test signal to at least one of the switches to thereby perform testing of the display panel.

7. The display panel as claimed in claim 1, wherein an orthogonal projection of the pixel electrodes on the substrate is at least partially overlapped with an orthogonal projection of the ESD protection circuits on the substrate.

8. The display panel as claimed in claim 1, wherein a thickness of a portion of the insulating layer interposed between the peripheral circuit and the pixel electrodes is greater than 15 kÅ.

9. The display panel as claimed in claim 1, further comprising:
   a plurality of data lines disposed on the substrate; and
   a plurality of scan lines disposed on the substrate and intersected with the data lines;
   wherein the peripheral circuit is configured to be electrically connected to at least one of the data lines or at least one of the scan lines; the ESD protection circuit is configured to electrically connect to at least one of the scan lines or at least one of the data lines, so as to prevent the display panel from being damaged by electrostatic discharge.

* * * * *